(12) United States Patent
Rizzo et al.

(10) Patent No.: US 6,936,763 B2
(45) Date of Patent: Aug. 30, 2005

(54) MAGNETIC SHIELDING FOR ELECTRONIC CIRCUITS WHICH INCLUDE MAGNETIC MATERIALS

(75) Inventors: Nicholas D. Rizzo, Gilbert, AZ (US); Mark A. Durlam, Chandler, AZ (US); Michael J. Roll, Scottsdale, AZ (US); Kelly Kyler, Mesa, AZ (US); Jaynal A. Molla, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 252 days.

(21) Appl. No.: 10/184,536

(22) Filed: Jun. 28, 2002

(65) Prior Publication Data

US 2004/0000415 A1 Jan. 1, 2004

(51) Int. Cl.[7] .............................................. H01B 11/00
(52) U.S. Cl. ............................ 174/35 R; 174/35 MS; 174/33; 205/118; 205/119; 361/816; 361/818
(58) Field of Search ........................... 174/35 R, 35 MS, 174/33; 205/118, 119; 361/816, 818

(56) References Cited

U.S. PATENT DOCUMENTS

| | | | |
|---|---|---|---|
| 4,953,002 A | 8/1990 | Nelson et al. | |
| 5,639,989 A | 6/1997 | Higgins | |
| 5,769,996 A | * 6/1998 | McArdle et al. | 156/272.4 |
| 5,883,762 A | 3/1999 | Calhoun et al. | |
| 5,939,772 A | 8/1999 | Hurst et al. | |
| 5,981,297 A | * 11/1999 | Baselt | 436/514 |
| 6,110,399 A | * 8/2000 | McArdle et al. | 252/513 |
| 6,350,951 B1 | 2/2002 | Askew | |
| 6,504,227 B1 | * 1/2003 | Matsuo et al. | 257/531 |
| 2002/0130339 A1 | * 9/2002 | Kishi et al. | 257/295 |
| 2002/0191451 A1 | * 12/2002 | Kishi et al. | 365/200 |

FOREIGN PATENT DOCUMENTS

JP 05145266 6/1993

* cited by examiner

Primary Examiner—Dean A. Reichard
Assistant Examiner—Jinhee Lee
(74) Attorney, Agent, or Firm—Patricia S. Goddard; Kim-Marie Vo

(57) ABSTRACT

Shielded electronic integrated circuit apparatus (5) includes a substrate (10), with an eletronic integrated circuit (15) formed thereon, and a dielectric region (12) positioned on the electronic integrated circuit. The dielectric region and the substrate are substantially surrounded by lower and upper magnetic material regions (26, 30), deposited using electrochemical deposition, and magnetic material layers on each side (32, 34). Each of the lower and upper magnetic material regions preferably include a glue layer (36, 40), a seed layer (28, 24), and an electrochemically deposited magnetic material layer (26, 30). Generally, the electrochemically deposited magnetic material layer can be conveniently deposited by electroplating.

23 Claims, 4 Drawing Sheets

MAGNETIC SHIELDING FOR ELECTRONIC CIRCUITS WHICH INCLUDE MAGNETIC MATERIALS

This invention was made with Government Support under Agreement No. MDA972-96-3-0016 awarded by DARPA. The Government has certain rights in the invention.

FIELD OF THE INVENTION

This invention relates to semiconductor devices.

More particularly, the present invention relates to an improved magnetic shielding for semiconductor devices which include magnetic materials.

BACKGROUND OF THE INVENTION

Interference from external magnetic fields is a serious problem in semiconductor devices that include magnetic materials. Such devices can include magnetic field sensors, magnetoresistive random access memory (hereinafter referred to as "MRAM") devices, or the like, and typically utilize the orientation of a magnetization vector for device operation. In MRAM devices, for example, the stability of the nonvolatile memory state, the repeatability of the read/write cycles, and the memory element-to-element switching field uniformity are three of the most important aspects of its design characteristics. These characteristics depend on the behavior and properties of the magnetization vector.

Storing data in a MRAM device is accomplished by applying magnetic fields and causing a magnetic material in the MRAM device to be magnetized into either of two possible memory states. Recalling data is accomplished by sensing the resistive differences in the MRAM device between the two states. The magnetic fields for writing are created by passing currents through conductive lines external to the magnetic structure or through the magnetic structures themselves.

If a magnetic field is applied to a MRAM device during writing, then the total field incident to the MRAM device may be less than that required for writing which can cause programming errors. In addition, a typical MRAM architecture has multiple bits that are exposed to magnetic fields when one MRAM device is programmed. These one-half selected MRAM devices are particularly sensitive to unintended programming from an external magnetic field. Further, if the magnetic field is large enough, MRAM devices may be unintentionally switched by the external magnetic field even in the absence of a programming current.

A method to decrease the effects of magnetic field interference is to magnetically shield the electronic circuit components. Prior art magnetic shielding solutions typically involve using a lid or enclosure surrounding a device, wherein the lid or enclosure may be connected to a ground potential. However, prior art shielding solutions are often too expensive and not easily integrated with the magnetic devices.

Accordingly, it is an object of the present invention to provide a new and improved magnetic shielding solution for electronic circuits which include magnetic materials.

SUMMARY OF THE INVENTION

To achieve the objects and advantages specified above and others, a shielded electronic integrated circuit apparatus is disclosed which includes a substrate and an electronic integrated circuit provided thereon said substrate. In the preferred embodiment, a dielectric region is positioned on the substrate and the electronic integrated circuit wherein the substrate and the dielectric region form an outer surface. A magnetic material layer is formed on the outer surface of the substrate and the dielectric region wherein the magnetic material layer is deposited using electrochemical deposition such that the substrate, dielectric region, and the magnetic material layer are integrated.

In the preferred embodiment, electrochemical deposition of the magnetic material layer is accomplished by forming a glue layer positioned on the outer surface of the substrate and the dielectric region and forming a seed layer positioned on the glue layer wherein the seed layer is subsequently immersed in an electrochemical deposition bath. In the preferred embodiment, the seed layer includes a conductive material, such as copper, and the electrochemical deposition bath includes a magnetic shielding materials, such as nickel-iron (NiFe), nickel-iron-molybdenum (NiFeMb), nickel-iron-cobalt (NiFeCo), or the like. Further, portions of the magnetic material layer may be formed using a magnetic epoxy, or similar molding material with ferromagnetic or superparamagnetic particles suspended therein.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
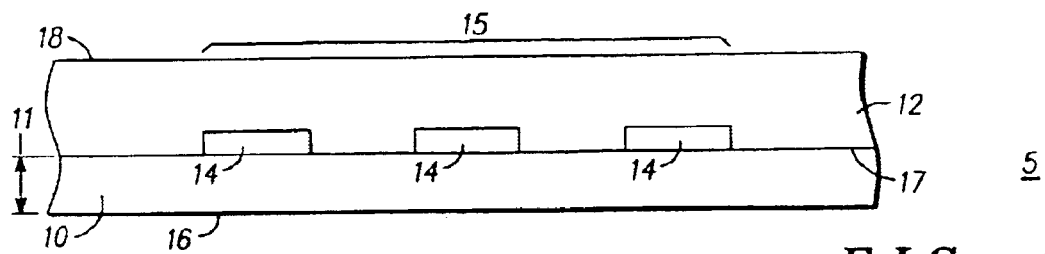
FIG. 1 is a sectional view of a step in the fabrication of a shielded electronic circuit apparatus in accordance with the present invention.

Turn now to FIG. 1, which illustrates a simplified sectional view of a shielded electronic integrated circuit apparatus 5 in accordance with the present invention. Apparatus 5 includes a substrate 10 with a thickness 11, wherein substrate 10 has a surface 17 and a surface 16. An electronic integrated circuit 15 is provided thereon said surface 17. In this embodiment, integrated circuit 15 includes a plurality of MRAM bits 14, but it will be understood that other magnetoresistive devices could be included. Also, it will be understood that while three MRAM bits are illustrated for convenience a complete array of devices or control/driver circuits around the periphery of an array of magnetic memory bits may be formed as die thereon substrate 10. Further, integrated circuit 15 typically includes interconnects and contact pads capable of transmitting signals to and from circuit 15, but these interconnects and contact pads are not illustrated for simplicity.

In the preferred embodiment, a dielectric region 12 is positioned on surface 17 of substrate 10 and electronic integrated circuit 15 wherein dielectric region 12 includes a surface 18. In the preferred embodiment, dielectric region 12 can include silicon nitride (SiN), silicon oxynitride (SiON), a polyimide, or combinations thereof. Dielectric region 12 acts as a passivation layer and as a stress buffer layer and is chosen to have a desired coefficient of thermal expansion to avoid cracking due to an elastic deformation with dielectric region 12 and subsequent layers formed thereon.

Figure 2:
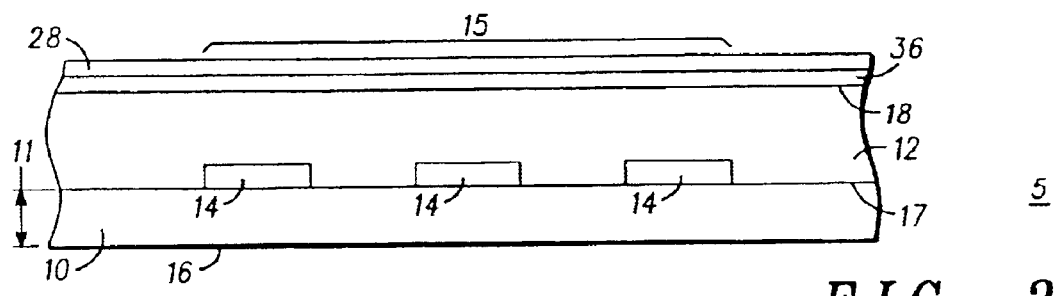
FIG. 2 is another sectional view of a step in the fabrication of a shielded electronic circuit apparatus in accordance with the present invention.
Figure 3:
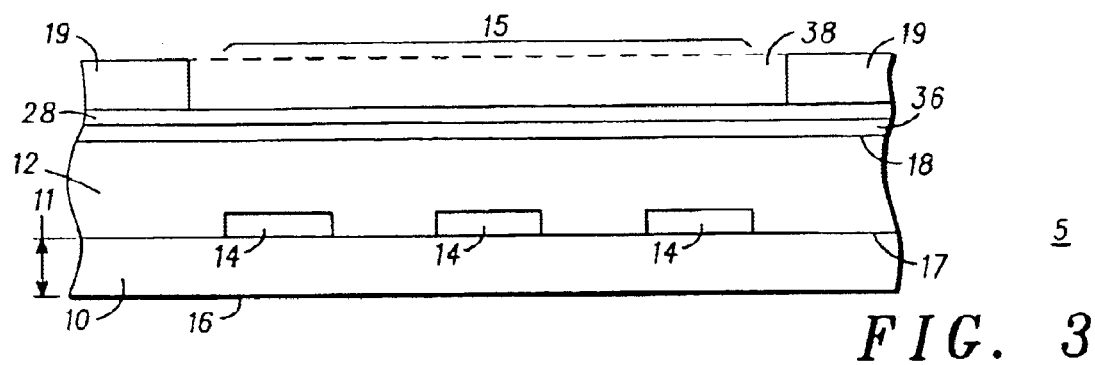
FIG. 3 is a sectional view of a step in the fabrication of a shielded electronic circuit apparatus in accordance with the present invention.

In the preferred embodiment and as illustrated in FIG. 2, a glue layer 36 is deposited on surface 18 of dielectric region 12. A seed layer 28 is deposited on glue layer 36. However, it will be understood that glue layer 36 is optional, but is included in the preferred embodiment to enhance the adhesion of seed layer 28. As illustrated in FIG. 3, a photoresist layer 19 is positioned on seed layer 28 and patterned and etched to form a trench 38 adjacent to integrated circuit 15.

Figure 4:
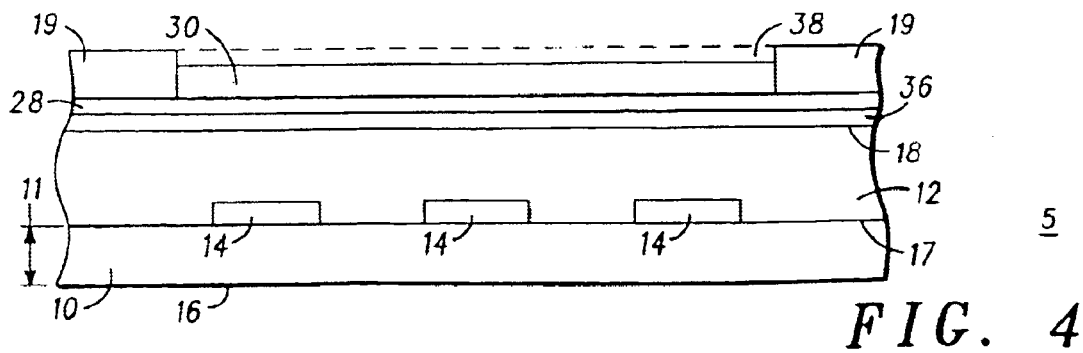
FIG. 4 is a sectional view of a step in the fabrication of a shielded electronic circuit apparatus in accordance with the present invention.
Figure 5:
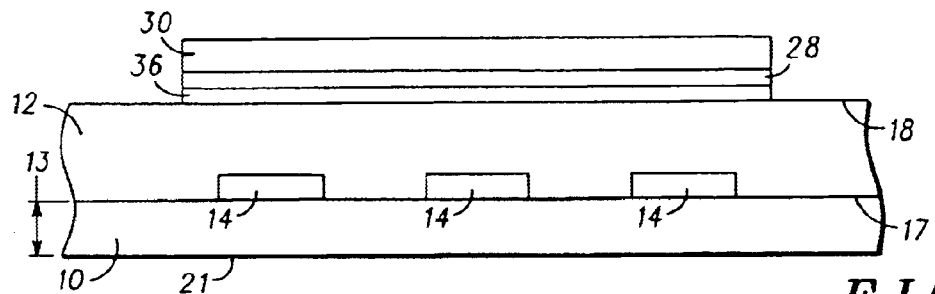
FIG. 5 is another sectional view of a step in the fabrication of a shielded electronic circuit apparatus in accordance with the present invention.

In the preferred embodiment and as shown in FIG. 4, a magnetic material layer 30 is formed within trench 38 by electroplating on seed layer 28. Turning now to FIG. 5, photoresist layer 19 is removed and layers 28 and 36 are patterned by wet or dry etching so that layers 28 and 36 are sandwiched therebetween magnetic material layer 30 and dielectric region 12. Further, in the preferred embodiment, substrate 10 is thinned to a thickness 13, which is less than thickness 11, to form a surface 21. However, it will be understood that thinning substrate 10 is optional, but this step is included in the preferred embodiment to improve the magnetic shielding characteristics, as will be discussed separately.

Photoresist layer 19 and the subsequent wet etch step to remove layers 28 and 36 are included to decrease the likelihood that a plurality of contact pads at the edge of the die are not electrically shorted together by layers 36, 28, or 30. Contact pads are generally used to provide a signal path to and from the interconnects which are electrically connected to circuit 15 wherein a wire bond is positioned on the contact pad.

Figure 6:
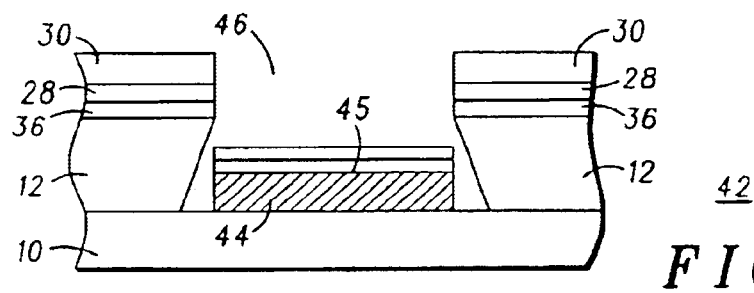
FIG. 6 is another sectional view of a step in the fabrication of a shielded electronic circuit apparatus in accordance with the present invention illustrating the formation of a contact pad.

By producing a negative undercut in dielectric layer 12, it is possible to eliminate photoresist layer 19 and subsequent wet etch steps. FIG. 6 illustrates an integrated circuit portion 42 of integrated circuit 15 with the formation of magnetic material proximate to a contact pad 44 with a surface 45. As shown in FIG. 6, dielectric region 12 adjacent to contact pad 44 is patterned and etched to form a trench 46 which has a negative sidewall. As a result, when glue layer 36 and seed layer 28 are deposited on surface 18 of dielectric region 12, a portion of layers 36 and 28 is also deposited on surface 45. However, the negative sidewall separates layers 36 and 28 positioned on surface 18 with layers 36 and 28 positioned on surface 45. Consequently, when magnetic material layer 30 is electroplated, magnetic material layer 30 is formed only on seed layer 28 positioned adjacent to surface 18 because contact pad 44 is electrically isolated.

Figure 7:
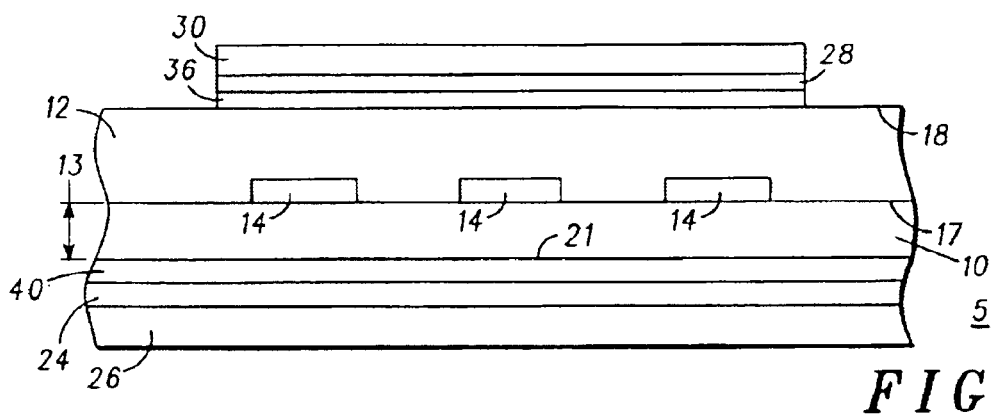
FIG. 7 is a sectional view of a step in the fabrication of a shielded electronic circuit apparatus in accordance with the present invention.

Magnetic shielding may also be provided on bottom surface 21. In the preferred embodiment, a glue layer 40 is positioned on surface 21 of substrate 10, as illustrated in FIG. 7. A seed layer 24 is positioned on glue layer 40. However, it will be understood that glue layer 40 is optional, but is included in the preferred embodiment to enhance the adhesion of seed layer 24. In the preferred embodiment, a magnetic material layer 26 is formed by electroplating on seed layer 24. In the preferred embodiment, glue layers 36 and 40 include titanium-tungsten (TiW), however it will be understood that glue layers 36 and 40 can include other suitable materials, such as titanium-nitride (TiN), tantalum nitride (TaN), or tantalum (Ta). Further, seed layers 24 and 28 can include copper or another suitable conductive material less noble than the material included in magnetic material layers 26 and 30. Also, layers 24, 28, 36, and 40 can be deposited using chemical vapor deposition (hereinafter referred to as "CVD"), physical vapor deposition (hereinafter referred to as "PVD"), or the like.

Further, magnetic material layers 26 and 30 can include nickel-iron (NiFe), nickel-iron-molybdenum (NiFeMb), iron-cobalt-boron (FeCoB), nickel-iron-cobalt (NiFeCo), nickel-copper-chromium-iron (NiCuCrFe), or alloys thereof, but it will be understood that other material systems may be used. For example, a mu metal may be appropriate wherein the mu metal and its compositions are well known to those skilled in the art and will not be elaborated upon further here. Magnetic material layers 26 and 30 can include any suitable material having sufficiently high permeability to shield integrated circuit 15 from a magnetic flux and be metallurgically compatible with the remaining material structure.

Magnetic permeability measures a materials ability to carry magnetic flux under the influence of a magnetic field. A material with a magnetic permeability is capable of conducting a magnetic field flux by allowing the microstructure of the magnetic material to magnetize through the alignment of magnetic domains. A material which includes magnetic domains is a ferromagnetic material. A ferromagnetic material is easily magnetized and, consequently, behaves as a very efficient magnetic shielding material.

Further, in the preferred embodiment magnetic material layers 26 and 30 include materials more noble than the material included in seed layers 24 and 28, respectively, to promote adhesion. Also, it will be understood that in some embodiments magnetic materials 26 and 30 can be electrodeposited simultaneously.

The method of forming magnetic material layers 26 and 30 involves using electrochemical deposition, such as electrolyticplating in the preferred embodiment, to form the necessary layers. However, it will be understood that other electrochemical deposition techniques, such as electroless plating or immersion, could be used wherein the fabrication steps will, in general, be different. Electrochemical deposition is used to form the various layers to improve thin film uniformity control and eliminate the need to use complicated and expensive vacuum deposition tools. Further, by using electrochemical deposition, thick layers can be formed in a shorter amount of time. Electrochemical deposition is a technique well known to those skilled in the art and will not be elaborated upon further here.

In another embodiment, portions of magnetic material layers 26 and 30 can include an amorphous magnetic material or a nanocrystalline magnetic material. Portions of magnetic material layers 26 and 30 can also include a plurality of ferromagnetic or superparamagnetic particles suspended in a non-magnetic matrix. The non-magnetic matrix can include an epoxy, polymer, metal, or another suitable non-magnetic matrix material. An epoxy is a thermosetting resin capable of forming tight cross-linked polymer structures characterized by toughness, strong adhesion, and low shrinkage, and is used especially in surface coatings and adhesives.

Figure 8:
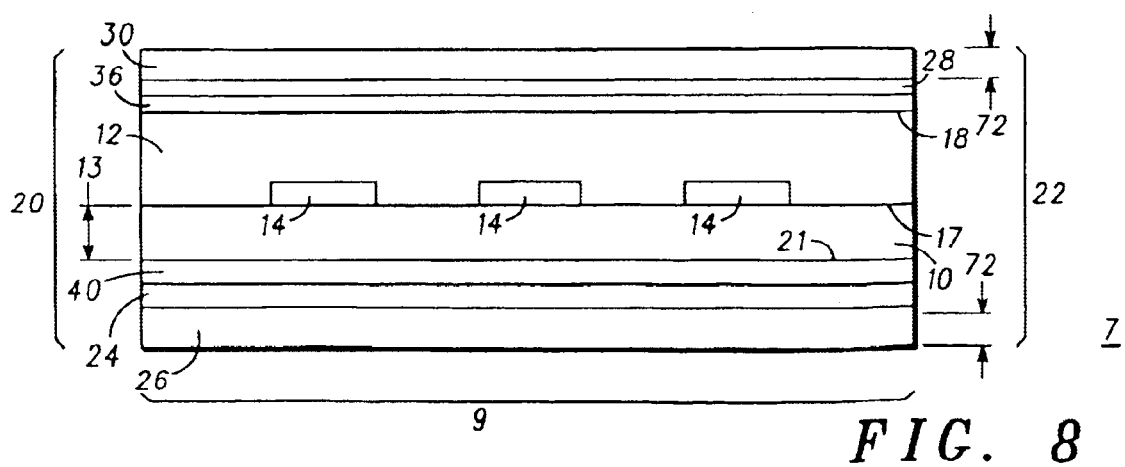
FIG. 8 is another sectional view of a step in the fabrication of a shielded electronic circuit apparatus in accordance with the present invention.

Turning now to FIG. 8, in the preferred embodiment integrated circuit 5 is cut into a die 7 with a width 9 and sides 20 and 22. It is well known to those skilled in the art that a plurality of integrated circuits are generally formed on the same substrate before being cut into individual die. This step decreases costs and allows the fabrication of a plurality of nearly identical integrated circuits. However, it will be understood that in some embodiments, a single die could be provided wherein this step may be optional.

Figure 9:
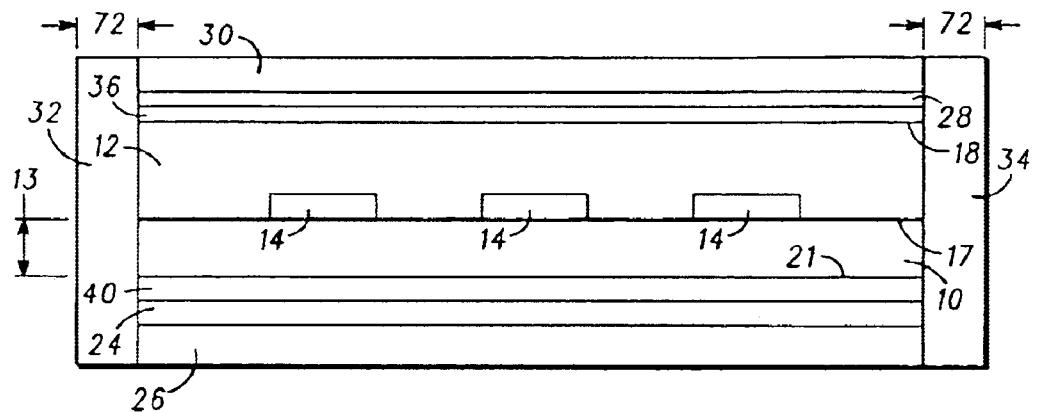
FIG. 9 is a sectional view of a step in the fabrication of a shielded electronic circuit apparatus in accordance with the present invention.

In the preferred embodiment and as illustrated in FIG. 9, a magnetic material layer 32 is formed on side 20 and a magnetic material layer 34 is formed on side 22, wherein electronic integrated circuit 5 is substantially surrounded by a magnetic material layer. It will be understood that portions of magnetic material layers 32 and 34 can include a magnetic epoxy or the like with ferromagnetic or superparamagnetic particles suspended therein.

Figure 10:
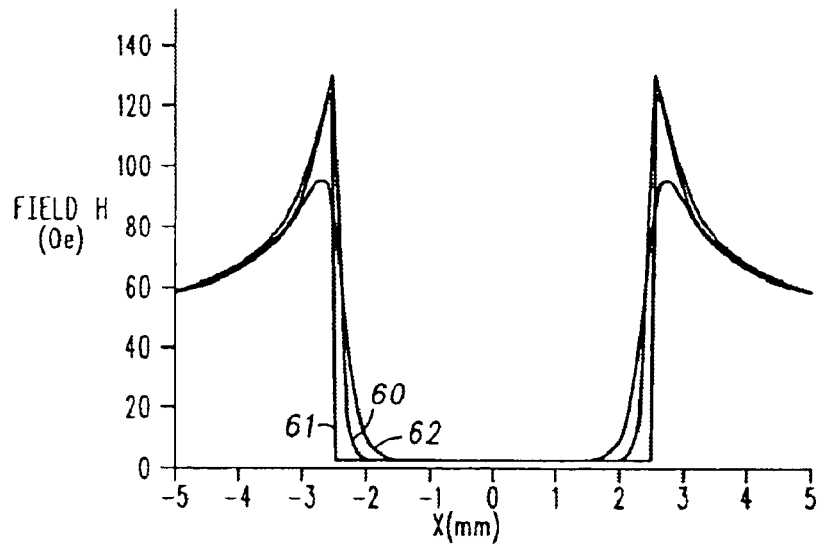
FIG. 10 is a plot illustrating the magnitude of the magnetic field oriented parallel to a length of a shielded electronic circuit apparatus in accordance with the present invention.

Turning now to FIG. 10, a plot illustrating the magnitude of a magnetic field in Oersteds oriented parallel to length 9 of die 7 is illustrated. Data for FIG. 10 are the result of a numerical magnetostatic simulation in two dimensions. However, similar results can be obtained using a three dimensional simulation. The simulation consists of applying a 50 Oersted magnetic field with a magnetic field vector oriented parallel to length 9 of die 7. The magnetic field magnitude is then measured along a line parallel to surface 17 and proximate to integrated circuit 15.

The simulation is performed under three conditions for illustrative purposes wherein it is assumed that magnetic material layers 26, 30, 32, and 34 have a thickness 72 equal to approximately 20 μm. It will be understood, however, that layers 26, 30, 32, and 34 can have different thicknesses but are assumed to have thickness 72 in this embodiment for ease of discussion. Further, for illustrative purposes magnetic material layers 26, 30, 32, and 34 are assumed to have a permeability of 2000 and a saturation flux density of 1 Tesla. Also in this example, it is assumed that length 9 is approximately 5 mm.

One simulation (plot 62) included in FIG. 10 is of die 7 as illustrated in FIG. 7, wherein die 7 is shielded by magnetic material layers 26 and 30 and thickness 13 is approximately 27 mils. Plot 62 demonstrates that magnetic material layers 26 and 30 reduce the magnetic field inside die 7 to approximately zero Oersteds when the magnetic field vector is oriented parallel to length 9.

The magnetic shielding effect can be understood in several ways. One explanation is that it is energetically preferable for the magnetic field to travel through the magnetic shielding material because of its high permeability. Another equivalent explanation is that magnetic charge develops predominantly at an end of the magnetic shielding material such that the magnetic field from the magnetic charge tends to cancel the applied magnetic field. This example indicates that in order to shield a large magnetic field without saturating, the magnetic shield material should either be thick or have a large saturation flux density. If the magnetic flux density is increased beyond the saturation value, then the magnetic field will generally penetrate through the magnetic shield.

Another simulation (plot 60) is of die 7 as illustrated in FIG. 7 wherein die 7 is shielded by magnetic material layers 26 and 30 and thickness 13 is approximately 13 mils. In this example, the shielding of the applied magnetic field occurs more quickly as function of distance into die 7 for a smaller thickness 13. The characteristic distance over which the magnetic field falls to zero is approximately the distance between the magnetic shield layers, which implies that better magnetic shielding is provided as thickness 13 is decreased.

Still another simulation (plot 61) is of die 7 as illustrated in FIG. 8 wherein die 7 is shielded by magnetic material layers 26, 30, 32, and 34, and thickness 13 is approximately 27 mils. When magnetic sidewalls 32 and 34 are included thereon die 7, the magnetic field decreases to approximately zero Oersteds almost immediately inside die 7. This design would be advantageous since magnetic circuitry can be positioned proximate to a side of die 7 without magnetic interference, and, consequently, increase the amount of usable surface 15 in which integrated circuit 15 can be formed. By increasing the amount of usable surface 15, the cost of fabricating shielded electronic integrated circuit 5 will decrease.

Figure 11:
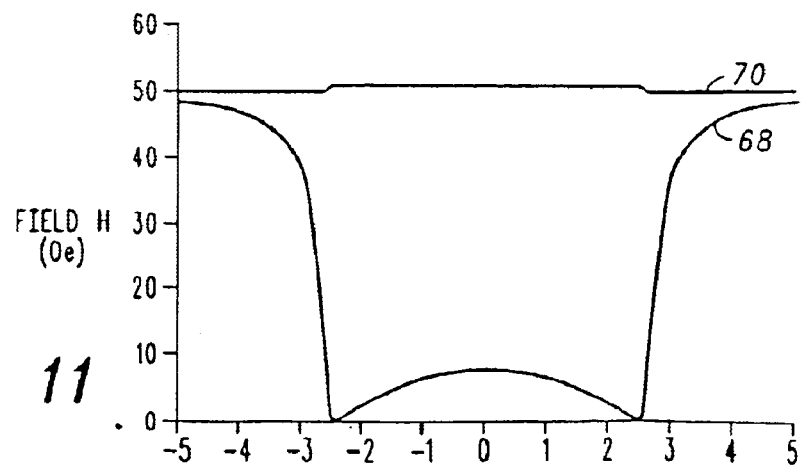
FIG. 11 is a plot illustrating the magnitude of the magnetic field oriented perpendicular to a length of a shielded electronic circuit apparatus in accordance with the present invention.

FIG. 11 is a plot illustrating the magnitude of the simulated magnetic field in Oersteds oriented perpendicular to length 9 of die 7. Data for FIG. 11 are the result of a numerical magnetostatic simulation in two dimensions. However, similar results can be obtained using a three dimensional simulation. In this example, the simulation consists of applying a 50 Oersted magnetic field with a magnetic field vector oriented perpendicular to length 9 of die 7. Included in FIG. 11 is a plot 68 for die 7 as illustrated in FIG. 8 and a plot 70 for die 7 as illustrated in FIG. 7. In this example, the magnetic shielding of perpendicular magnetic fields is dramatically improved when magnetic layers 32 and 34 are included thereon die 7 indicating that magnetic sidewalls are useful to shield out of plane magnetic fields.

A reason for this result is that layers 26 and 30 are not permeable in the perpendicular direction due to an out of plane demagnetizing field of a thin film. However, layers 32 and 34 do have significant permeability in the perpendicular direction and, thus, can provide magnetic shielding in combination with layers 26 and 30.

Figure 12:
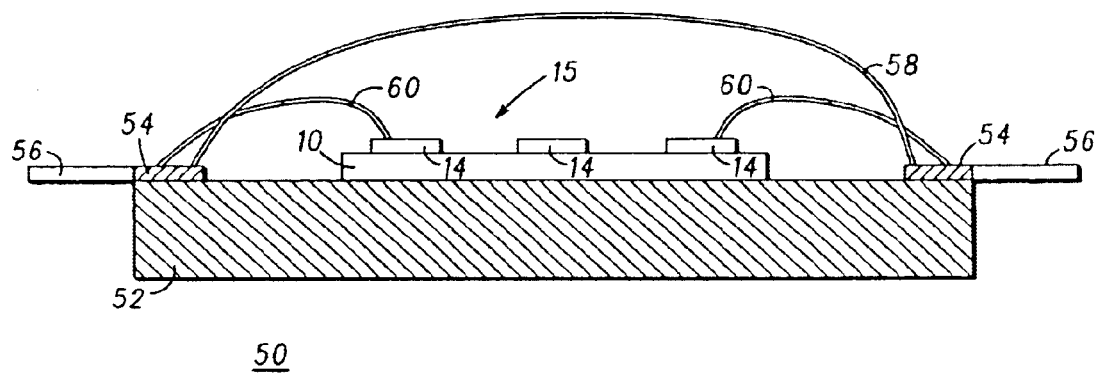
FIG. 12 is a sectional view of a shielded electronic integrated apparatus with a shielded metal support in accordance with the present invention.

Turn now to FIG. 12 which illustrates another embodiment of a shielded electronic integrated circuit apparatus 50 wherein substrate 10 with integrated circuit 15 is mounted to a metal support 52 with an adhesive (not shown). Metal support 52 can include, for example, a lead frame, a ball grid array, or the like. Metal support 52 can include a magnetic material to increase its magnetic shielding capability. Support 52 also includes a contact pad 54 and a metal lead 56, wherein a wire bond 60 is positioned to make electrical contact with MRAM bit 14 and contact pads 54 as illustrated. A shielding material layer 58 is then formed adjacent to substrate 10 and metal support 52.

In some embodiments, shielding material layer 58 can include a magnetic epoxy or similar molding material with ferromagnetic or superparamagnetic particles suspended therein. Further, metal support 52 can have a magnetic material layer electroplated thereon, or be made out of a magnetic material, so that substrate 10 is substantially surrounded by a magnetic material layer. In another embodiment, shielding can be provided by superparamagnetic particles suspended in a non-magnetic matrix such that integrated circuit 15 is substantially surrounded by the non-magnetic matrix. The non-magnetic matrix could include an epoxy, a polymer, a metal, or the like.

In general, the size of the particles suspended therein the non-magnetic matrix should be on the order of tens of microns. However, such particles can sometimes have undesirable magnetic characteristics, as shown in a hysteresis curve 80 in FIG. 13. A large remanent magnetization $M_r$ or coercivity $H_c$ will prevent the magnetic material from optimally shielding integrated circuit 15. Further, the magnetic characteristics of larger particles can depend sensitively on the particle composition, method of fabrication, shape, etc.

Figure 13:
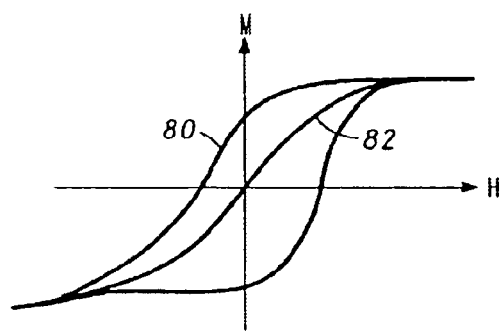
FIG. 13 is a plot of a hysteresis curve for a typical magnetic material and a magnetic material including an epoxy with superparamagnetic particles suspended therein.

To obtain a more ideal hysteresis loop 82 as shown in FIG. 13, the size of the particles suspended in the magnetic epoxy can be chosen such that they become superparamagnetic. As the particle size decreases, the magnetic particles in the epoxy demagnetize due to thermal excitations. This effect is known as superparamagnetism and results in zero remanent magnetization $M_r$ and zero coercivity $H_c$ for the particles when measured at a particular frequency.

The particle size to get superparamagnetic behavior is approximately 1 $\mu$m or less. However, if the particle size is too small, then thermal demagnetization effects become too strong and the permeability will decrease. The permeability of superparamagnetic particles is quite high (i.e. approximately 1000–10,000) for very effective magnetic field shielding. An additional advantage of superparamagnetic particles is that they are isotropic in their magnetic properties.

The time for the thermal demagnetization of a particle is given approximately as $\tau=\tau_0 \exp[KV/\kappa T]$, where $\tau_0$ is on the order of 1 nanosecond, K is the magnetic anisotropy, V is the volume of the particle, K is Boltzmann's constant, and T is the temperature. Since K is relatively fixed for a given magnetic material, thermal demagnetization or superparamagnetism is easily observed by decreasing V so that $\tau$ is less than 1 second, or $KV/\kappa T$ is less than 25. Since K is typically 1000 erg/cm$^3$, the diameter of the magnetic particle should be on the order of 0.1 $\mu$m (or less if K is larger) to achieve adequate superparamagnetism.

As follows from the definition of $\tau$, the superparamagnetic demagnetization occurs at shorter times for smaller V. Therefore, smaller particles are necessary to shield against higher frequency magnetic fields. In general, $\tau$ should be less than 1/f, where f is the frequency of the external magnetic field, so that the particles are able to demagnetize and follow the magnetic field and provide adequate magnetic field shielding.

Thus, a new and improved shielded integrated circuit is disclosed. The shielded integrated circuit reduces the presence of electromagnetic interference by forming magnetic material shielding layers proximate to an integrated circuit by using electrochemical deposition. The shielded integrated circuit is more compatible with portable electronic systems because the magnetic material layers are integrated with the electronic circuitry and, consequently, formed more compactly. The shielded integrated circuit is also less expensive because electroplating avoids the need to use expensive and complicated vacuum deposition tools.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A shielded electronic circuit apparatus comprising:
   an electronic circuit positioned on a surface of a substrate wherein the substrate has a thickness and includes an opposed surface and at least one side;
   a dielectric region positioned on the electronic circuit wherein the dielectric region includes a surface and at least one side;
   a first magnetic material region positioned on the opposed surface of the substrate, wherein the first magnetic material region includes a seed layer; and
   a second magnetic material region positioned proximate to the surface of the dielectric region.

2. Apparatus as claimed in claim 1 wherein the first magnetic material region and the second magnetic material region each include a layer of magnetic material, the layer of magnetic material in at least one of the first and second magnetic material regions including an electrochemically deposited layer of magnetic material.

3. An apparatus as claimed in claim 2 wherein the layer of magnetic material in the first magnetic material region includes an electrolytically plated layer of magnetic material.

4. An apparatus as claimed in claim 1 wherein the second magnetic material region includes at least one of a second seed layer and a second glue layer wherein the second glue layer is positioned adjacent to the surface of the dieletric region, the second seed layer being positioned on the second glue layer.

5. An apparatus as claimed in claim 1 wherein at least a portion of the first magnetic material regions includes one of an amorphous magnetic material and a nanocrystalline magnetic material.

6. An apparatus as claimed in claim 1 wherein a third magnetic material region is positioned on the at least one side of the substrate.

7. An apparatus as claimed in claim 6 wherein the third magnetic material region includes a first magnetic epoxy.

8. An apparatus as claimed in claim 6 wherein at least a portion of the third magnetic material region includes one of a plurality of superparamagnetic particles suspended in a non-magnetic matrix, a plurality of ferromagnetic particles suspended in the non-magnetic matrix, a magnetic material layer, and a combination thereof.

9. An apparatus as claimed in claim 8 wherein the non-magnetic matrix includes one of an epoxy, a polymer, a metal, and another suitable non-magnetic matrix material.

10. An apparatus as claimed in claim 1 wherein the dielectric region includes one of silicon oxide, polymide, silicon nitride, silicon oxynitride, and combinations thereof.

11. An apparatus as claimed in claim 1 wherein the second magnetic material region includes one of a plurality of superparamagnetic particles suspended in a non-magnetic matrix, a plurality of ferromagnetic particles suspended in the non-magnetic matrix, a magnetic material layer, and a combination thereof.

12. An apparatus as claimed in claim 11 wherein the magnetic material layer includes one of nickel, iron, cobalt, molybdenum, and alloys thereof.

13. An apparatus as claimed in claim 1 wherein the first magnetic material region further includes a first glue layer positioned adjacent to the opposed surface of the substrate.

14. An apparatus as claimed in claim 13 wherein the first glue layer includes one of titanium tungsten, titanium nitride, tantalum, tantalum nitride, and another suitable material that has the desired properties for adhesion.

15. An apparatus as claimed in claim 13 wherein the first seed layer includes one of copper and another suitable conductive material less noble than material included in a layer of magnetic material in the first magnetic material region.

16. An apparatus as claimed in claim 1 wherein the thickness if the substrate is chosen to increase a shielding from an electromagnetic field.

17. An apparatus as claimed in claim 16 wherein the thickness of the substrate is chosen to be approximately in the range from 11 mils to 40 mils.

18. Shielded electronic circuit apparatus comprising:

an electronic circuit positioned on a surface of a substrate wherein the substrate has a thickness and includes an opposed surface and at least one side;

a dielectric region positioned on the electronic circuit wherein the dielectric region includes a surface and at least one side;

a first magnetic material region positioned on the opposed surface of the substrate;

a second magnetic material region positioned proximate to the surface of the dielectric region;

a third magnetic material region positioned on the at least one side of the substrate; and at least a portion of the first, second, and third magnetic material regions including one of a plurality of superparamagnetic particles suspended in a non-magnetic matrix, a plurality of ferromagnetic particles suspended in a non magnetic matrix, a magnetic material layer, and a combination thereof.

19. An apparatus as claimed in claim 18 wherein the non-magnetic matrix includes one of an epoxy, a polymer, a metal, and another suitable non-magnetic matrix material.

20. An apparatus as claimed in claim 18 wherein the dielectric region includes one of silicon oxide, polymide, silicon nitride, silicon oxynitride, and combinations thereof.

21. An apparatus as claimed in claim 18 wherein at least one of the first and second magnetic material regions includes a seed layer, a glue layer, and an electrochemically deposited layer of magnetic material, wherein the glue layer is positioned adjacent to one of the opposed surface of the substrate and the surface of the dielectric region, the seed layer being positioned on the glue layer, and the layer of magnetic material being deposited on the seed layer.

22. An apparatus as claimed in claim 21 wherein the glue layer includes one of titanium tungsten, titanium nitride, tantalum, tantalum nitride, and another suitable material that has the desired properties for adhesion.

23. An apparatus as claimed in claim 21 wherein the seed layer includes one of copper and another suitable conductive material less noble than the material included in the layer of magnetic material.

* * * * *